(12) United States Patent
Park et al.

(10) Patent No.: US 8,168,968 B2
(45) Date of Patent: May 1, 2012

(54) THIN FILM TRANSISTOR AND ORGANIC LIGHT EMITTING DISPLAY DEVICE USING THE SAME

(75) Inventors: Jin-Seong Park, Yong (KR); Kwang-Suk Kim, Yong (KR); Jae-Kyeong Jeong, Yongin (KR); Yeon-Gon Mo, Yongin (KR)

(73) Assignee: Samsung Mobile Display Co., Ltd. (KR)

( * ) Notice: Subject to any disclaimer, the term of this patent is extended or adjusted under 35 U.S.C. 154(b) by 165 days.

(21) Appl. No.: 12/826,418

(22) Filed: Jun. 29, 2010

(65) Prior Publication Data

US 2011/0108830 A1  May 12, 2011

(30) Foreign Application Priority Data

Nov. 11, 2009  (KR) .................. 10-2009-0108569

(51) Int. Cl.
*H01L 29/786* (2006.01)

(52) U.S. Cl. ................ 257/43; 257/57; 257/64; 257/66; 257/72

(58) Field of Classification Search ............... 257/43, 257/57, 64–66, 72, 75, 512
See application file for complete search history.

(56) References Cited

U.S. PATENT DOCUMENTS

| 7,989,899 B2 * | 8/2011 | Yin et al. | 257/402 |
| 2010/0059744 A1 * | 3/2010 | Yin et al. | 257/43 |

FOREIGN PATENT DOCUMENTS

| JP | 2006-005294 | 1/2006 |
| JP | 2006-186319 | 7/2006 |
| JP | 2007-250884 | 9/2007 |
| JP | 2008186319 | 8/2008 |
| KR | 1020060032827 A | 4/2006 |
| KR | 1020090110193 A | 10/2009 |

OTHER PUBLICATIONS

Korea Office Action corresponding to Korean Priority Application No. 10-2009-0108569 dated Nov. 21, 2011, 3 pages.
Office Action dated Dec. 23, 2011 corresponding to Korean Priority Application No. 10-2009-0108569, 1 page.
Korean Office Action issued for the corresponding Korean priority Patent Application 10-2009-0108569 dated Mar. 23, 2011, 3 pages.

* cited by examiner

*Primary Examiner* — Dung A. Le
(74) *Attorney, Agent, or Firm* — Knobbe Martens Olson & Bear LLP

(57) ABSTRACT

There is provided a thin film transistor exhibiting stable reliability and electrical characteristics by forming an active layer by adding material having a large difference of electronegativity from oxygen like Hf and an atomic radius similar to that of Zn or SN to an oxide semiconductor made of ZnSnO to adjust concentration of carrier and to enhance reliability of the oxide semiconductor, and an organic light emitting display device having the same.

20 Claims, 4 Drawing Sheets

THIN FILM TRANSISTOR AND ORGANIC LIGHT EMITTING DISPLAY DEVICE USING THE SAME

CROSS-REFERENCE TO RELATED APPLICATION

This application claims priority to and the benefit of Korean Patent Application No. 10-2009-0108569, filed on Nov. 11, 2009, in the Korean Intellectual Property Office, the entire content of which is incorporated herein by reference.

BACKGROUND OF THE INVENTION

1. Field of the Invention

The present embodiments relate to a thin film transistor, and more particularly, to a thin film transistor having an oxide layer and an organic light emitting display device having the same.

2. Description of the Related Art

An active matrix flat display device such as a liquid crystal display device or an organic light emitting display device includes at least one thin film transistor (TFT) in each pixel.

The thin film transistor includes an active layer providing a channel region, a source region, and a drain region, and a gate electrode formed in an upper side of the channel region and electrically insulated from the active layer by a gate insulating layer.

The active layer of the TFT is generally formed into a semiconductor layer such as amorphous silicon or poly-silicon.

When the active layer is made of amorphous silicon, mobility is low so that it is difficult to implement a driving circuit operated at high speed.

When the active layer is made of poly-silicon, the mobility is high but its polycrystalline nature causes threshold voltage not to be uniform.

Meanwhile, when low temperature poly-silicon (LTPS) is used as an active layer, the active layer exhibits high mobility and stable DC stability. However, it is difficult to implement a large scale TFT and an additional expensive crystallizer is required which causes manufacturing costs to increase.

In order to solve the above-mentioned problems, recent research for using oxide semiconductors such as ZnO and InGaZnO as an active layer have been carried out. However, these oxide semiconductors have higher mobility than amorphous silicon and better uniformity than low temperature poly-silicon but have drawbacks in terms of mass production.

Some oxide semiconductors have unstable DC stability in connection with reliability of a TFT device so that threshold voltage continuously moves during the operations and it is difficult to implement desired characteristics of the device.

SUMMARY OF THE INVENTION

The present embodiments provide a thin film transistor exhibiting stable reliability and electrical characteristics by forming an active layer by adding material having a large difference of electronegativity from oxygen like Hf and an atomic radius similar to that of Zn or Sn to an oxide semiconductor made of ZnSnO to adjust concentration of carrier and to enhance reliability of the oxide semiconductor, and an organic light emitting display device having the same.

In order to achieve the foregoing and/or other aspects of the present embodiments, according to an aspect of the present embodiments, there is provided a thin film transistor including: an oxide semiconductor layer as an active layer including a source/drain region and a channel region; a gate electrode formed in a region overlapping with the channel region; a gate insulating layer formed between the oxide semiconductor layer and the gate electrode; and source/drain electrodes electrically connected to the source/drain regions of the oxide semiconductor layer; wherein the oxide semiconductor layer is made by adding a material X having an electronegativity difference from oxygen of at least 2 and an atomic radius similar to that of Zn or Sn to the oxide semiconductor of ZnSnO.

When contents of positive ions X, Zn, and Sn forming the oxide semiconductor layer are converted into percentage, content of X is from about 2 to about 20%.

Electronegativity of the material X is less than about 1.6, an ion radius of the material X is from about 0.007 to about 0.008 nm, and the material X is one of Hf, Zr, Al, and Mg.

The thin film transistor further includes a protective layer formed between the oxide semiconductor layer and the source/drain electrodes, and has an inverted staggered bottom gate structure or a top gate structure.

There is also provided an organic light emitting display device including: pixels positioned at substantially every intersection of data lines and scan lines and respectively including a plurality of thin film transistors; a scan driving unit including a plurality of thin film transistors and supplying scan signals to the scan lines; a data driving unit including a plurality of thin film transistors and supplying data signals to the data lines; each of the thin film transistors provided to at least one of the pixels, the scan driving unit, and the data driving unit including: an oxide semiconductor layer as an active layer including source/drain region and a channel region; a gate electrode formed in a region overlapping with the channel region; a gate insulating layer formed between the oxide semiconductor layer and the gate electrode; and source/drain electrodes electrically connected to the source/drain regions of the oxide semiconductor layer; wherein the oxide semiconductor layer is made by adding a material X having higher 2 difference of electronegativity from oxygen and an atomic radius similar to that of Zn or Sn to the oxide semiconductor of ZnSnO.

According to the present embodiments, the active layer is formed by adding material having high difference of electronegativity from oxygen like Hf and an atomic radius similar to that of Zn or SN to an oxide semiconductor made of ZnSnO to adjust concentration of carrier and to enhance reliability of an oxide semiconductor, so that stable reliability and electrical characteristics of a thin film transistor can be realized.

BRIEF DESCRIPTION OF THE DRAWINGS

The accompanying drawings, together with the specification, illustrate exemplary embodiments, and, together with the description, serve to explain the principles of the present embodiments.

DETAILED DESCRIPTION OF THE INVENTION

Figure 1A:
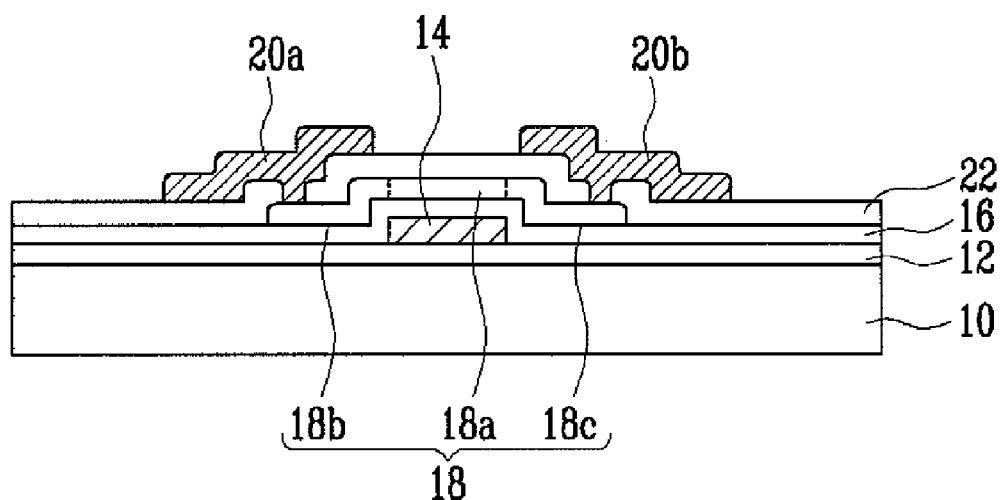
FIGS. 1A and 1B are sectional views illustrating a thin film transistor according to an embodiment.

In the following detailed description, only certain exemplary embodiments have been shown and described, simply by way of illustration. As those skilled in the art would realize, the described embodiments may be modified in various different ways, all without departing from the spirit or scope of the present embodiments. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to another element or be indirectly connected to the another element with one or more intervening elements interposed therebetween. Hereinafter, like reference numerals refer to like elements.

Hereinafter, the present embodiments will be described such that those skilled in the art can easily practice the present embodiments in detail with reference to the accompanying drawings.

Figure 1B:
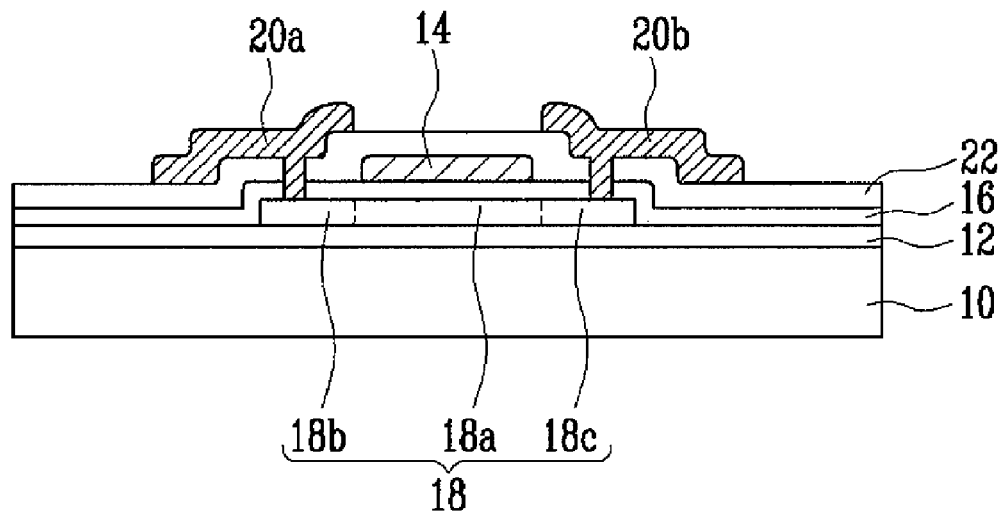

FIGS. 1A and 1B are sectional views illustrating a thin film transistor according to an embodiment.

Here, the thin film transistor as illustrated in FIG. 1A has an inverted staggered bottom gate structure and the thin film transistor as illustrated in FIG. 1B has a top gate structure, however, the embodiments are not limited thereto.

Referring to FIG. 1A, a buffer layer 12 is formed on a substrate 10 and a gate electrode 14 is formed on the buffer layer 12.

An insulating layer 16 is formed on an upper side including the gate electrode 14, and an oxide semiconductor layer 18 as an active layer providing a channel region 18a, a source region 18b, and a drain region 18c is formed on the insulating layer 16.

Moreover, as illustrated, a protective layer 22 is formed on the oxide semiconductor layer 18, a via hole is formed in a predetermined region (region corresponding to the source and drain region) of the protective layer 22, and source and drain electrodes 20a and 20b which are formed on the protective layer 22 through the via hole contact the respective source and drain regions of the oxide semiconductor layer 18 so that a bottom gate thin film transistor is completed.

Referring to FIG. 1B, a buffer layer 12 is formed on a substrate 10 and an oxide semiconductor layer 18 as an active layer providing a channel region, a source region, and a drain region is formed on the buffer layer 12.

An insulating layer 16 is formed on the oxide semiconductor layer 18 and a gate electrode is formed on the insulating layer at a position overlapping with the channel region of the oxide semiconductor layer 18.

As illustrated in drawings, a protective layer 22 is formed on the gate electrode, a via hole is formed in a predetermine region (corresponding to the source and drain regions) of the protective layer 22 and the insulating layer 16, and source and drain electrodes 20a and 20b which are formed on the protective layer 22 through the via hole contact the respective source and drain regions of the oxide semiconductor layer 18, so that a top gate thin film transistor is completed.

According to the existing art, the oxide semiconductor used as an active layer of the thin film transistor is generally made of ZnO or InGaZnO. In this existing oxide semiconductor, since a threshold voltage continuously moves during the operation due to unstable DC stability in connection with reliability of the TFT device, it is difficult to implement desired characteristics of a device.

Therefore, in an oxide semiconductor according to an embodiment, in order to overcome the above-mentioned drawbacks, an active layer is formed by adding material having a large difference of electronegativity with oxygen and an atomic radius similar to that of Zn or Sn to an oxide semiconductor made of ZnSnO so that carrier concentration can be adjusted and reliability of the oxide semiconductor can be enhanced.

The oxide semiconductor according to the embodiment as illustrated in FIGS. 1A and 1B is an oxide semiconductor, [X]ZnSnO oxide semiconductor made by doping transition metal X having an atomic radius similar to that of Zn or Sn and a large difference of electronegativity from oxygen to adjust carrier concentration of the ZnSnO oxide semiconductor and to enhance reliability of the oxide semiconductor.

When amounts of positive ions, X, Zn, and Sn are converted into percentage, e.g., when it is assumed that (X+Zn+Sn) is 100%, X is from about 2 to about 20%. This is because when an S value indicating mobility and a sub-threshold slope is achieved voltage X is deteriorated.

When the amount of X is increased, the carrier concentrate of [X]ZnSnO semiconductor according to the embodiment is decreased. This is because the large difference of electronegativity of X from oxygen reinforces the coupling force with oxygen in a matrix of the oxide semiconductor resulting in reducing carrier concentration generated by oxygen vacancy. However, this phenomenon enhances reliability of a semiconductor, particularly DC stability and processing temperature (to about 400 degrees Celcius).

Therefore, in this embodiment, when amounts of positive ions X, Zn, and Sn forming an oxide semiconductor layer are converted into percentage, X is from about 2 to about 20% so that the carrier concentration of the oxide semiconductor layer according to the embodiment is maintained under $10^{18}$/cm$^3$ and can exhibit characteristics of an active layer.

Here, X, as described above, is made of material having a large difference of electronegativity from oxygen and an ion radius similar to Zn or Sn, such as, for example, Hf, Zr, Al, or Mg.

X may be implemented by an element having a difference of electronegativity from oxygen of at least about 2 by considering ion coupling, and since this characteristic holds oxygen, reliability of the oxide semiconductor can be enhanced.

The electronegativity of X satisfies an equation of "electronegativity of oxygen (ENo)−electronegativity of X (ENx)≧2". In this case, since the electronegativity of oxygen is 3.5, X may be selected from materials having electronegativity less than 1.6.

In a case when the ion radius of the material X is large, and lattice distortion is generated due to a difference of crystal radius at the coupling, this increases internal strain energy and oxygen vacancy is increased. This is due to the unstable crystal due to the increased strain energy so that reliability is decreased. Therefore, the ion radius of the material X is similar to or less than that Zn or Sn.

That is, since ion radius of Zn and Sn is about 0.007 to 0.008 nm, the material X may be selected from Zn and Sn or a similar material.

Hf, Zr, Al, and Mg are typical material having the above-mentioned condition, electronegativity less than 1.6 and ion radius of about 0.007 to 0.008 nm, therefore X may, for example, be Hf, Zr, Al or Mg. In some embodiments, X has an ion radius of from about 0.002 nm to about 0.013 nm. In other embodiments, X has an ion radius of from about 0.005 nm to about 0.010 nm. In other embodiments, X has an ion radius of from about 0.006 nm to about 0.009 nm. In some embodiments, X has an ion radius of from about 0.007 nm to about 0.008 nm.

Figure 2A:
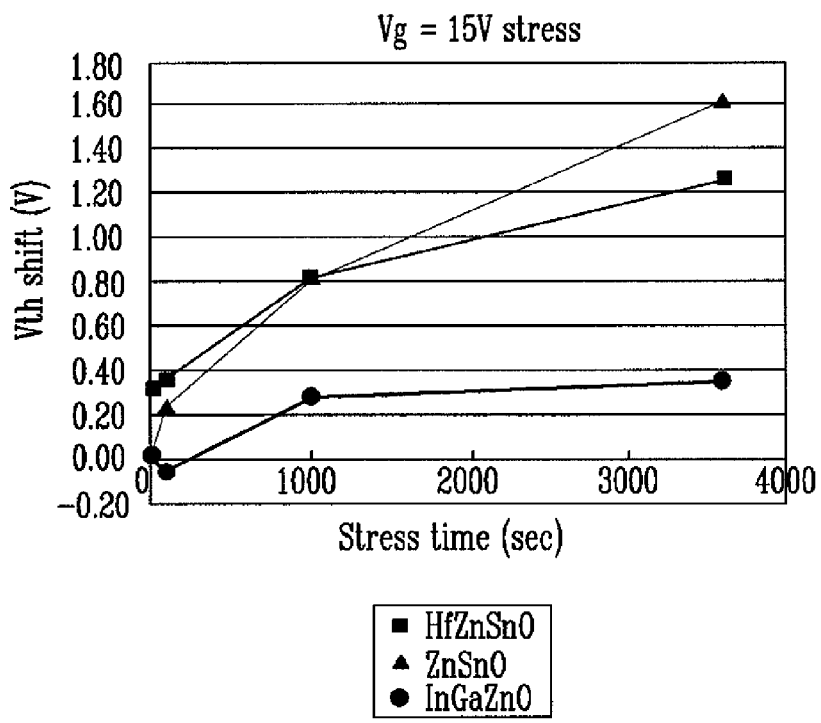
FIG. 2A is a graph illustrating variation of a threshold voltage of the TFT according to time under gate DC stress.
Figure 2B:
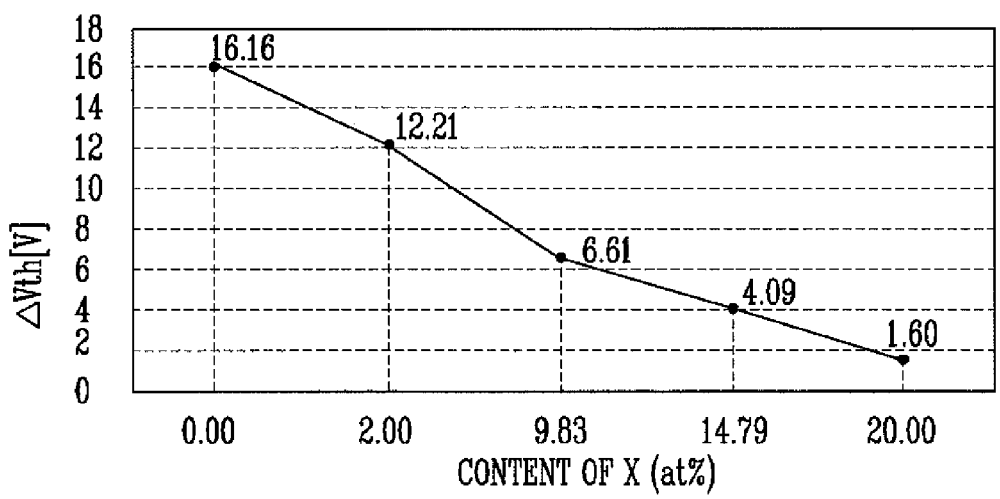
FIG. 2B is a graph illustrating variation of a threshold voltage (−Vth) of the TFT with respect to content of X of [X]ZnSnO semiconductor according to an embodiment.
Figure 2C:
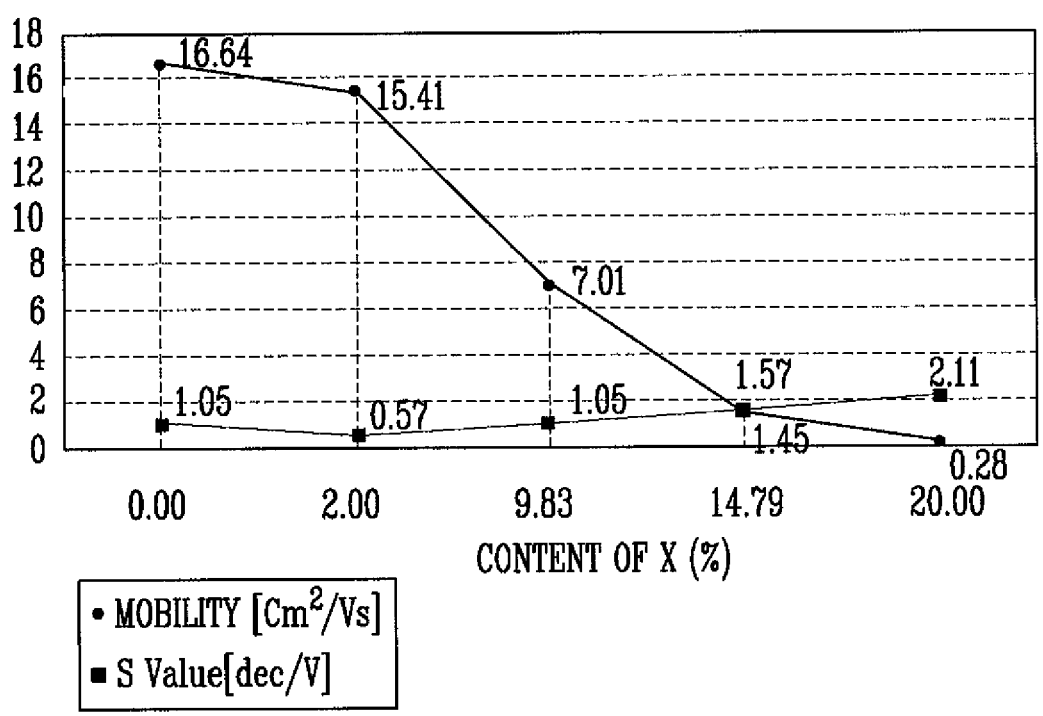
FIG. 2C is a graph illustrating variation of mobility and an S value with respect to content of X of [X]ZnSnO semiconductor according to the embodiment.

Characteristics of the TFT having the above-mentioned oxide semiconductor layer according to the embodiment may are shown in FIGS. 2A to 2C.

FIG. 2A is a graph illustrating variation of a threshold voltage of the TFT according to time under gate DC stress of 15V, and shows the TFT in which [X]ZnSnO semiconductor, [X]ZnSnO oxide semiconductor is used as an active layer according to the embodiment exhibits excellent DC stability in connection with reliability of a TFT device in comparison to an existing oxide (ZnSnO and InGaZnO) thin film transistor.

Next, FIG. 2B is a graph illustrating variation of a threshold voltage (−Vth) of the TFT with respect to content of X of [X]ZnSnO semiconductor according to an embodiment, and FIG. 2C is a graph illustrating variation of mobility and an S value with respect to content of X of [X]ZnSnO semiconductor according to the embodiment. Here, X is Hf.

Referring to FIGS. 2B and 2C, when the content of X is increased, variation of the threshold voltage is decreased and reliability is enhanced but mobility and S value are deteriorated.

In some embodiments, the content of X is from 2 to about 20%. When the content of X is in the range, reliability of the TFT can be enhanced and operative characteristics (mobility and S value) of the TFT can be improved.

When −Vth of 12.21 V at the content 2% of X, as illustrated in FIG. 2B, is compared with −Vth of 16.16V without X, considerable enhancement of reliability can be achieved. In the case of the content 20% of X, since −Vth is 1.60V, the enhancement of reliability can be maximized.

Referring to FIG. 2C, mobility and S value are 0.28 cm$^2$/Vs and 2.11 dec/V respectively when the content of X is 20%. When the content of X is higher than that, characteristics of a TFT are not guaranteed.

Figure 3A:
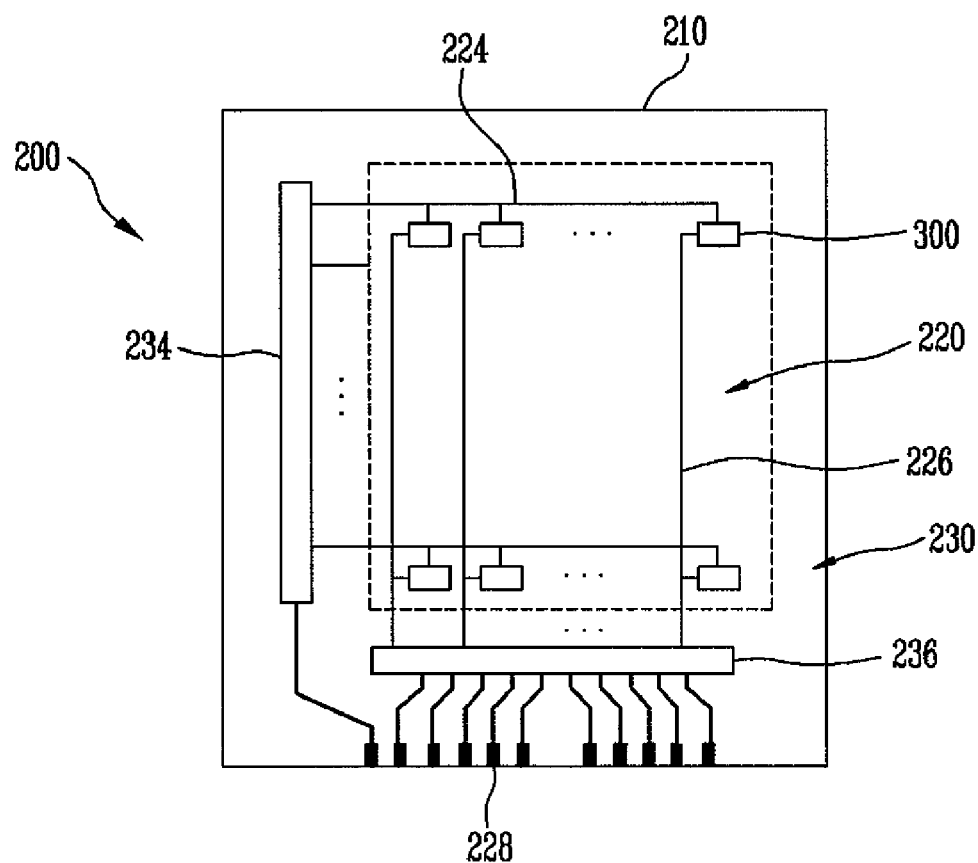
FIGS. 3A and 3B are a plan view and a sectional view respectively illustrating an organic light emitting display device according to an embodiment.
Figure 3B:
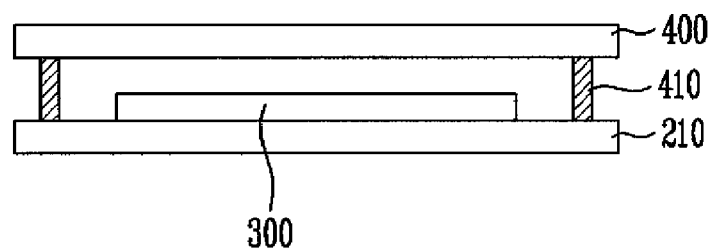

FIGS. 3A and 3B are a plan view and a sectional view respectively illustrating an organic light emitting display device according to an embodiment.

Hereinafter, an organic light emitting display device as an embodiment of a flat panel display device having the thin film transistor as described with reference to FIG. 1 will be described.

Referring to FIG. 3A, a substrate 210 is defined by a pixel region 220 and a non-pixel region 230 surrounding the pixel region 220. A plurality of pixels 300 connected between scan lines 224 and data lines 226 in matrix type are formed on the substrate 210 of the pixel region 220. On the substrate 210 of the non-pixel region 230, scan lines 224 and data lines 226 extended from the scan lines 224 and the data lines 226 of the pixel region 220, a power supply line (not shown) for operating the respective pixels 300, and a scan driving unit 234 and a data driving unit 236 for processing signals provided from the exterior through a pad 228 to provide the processed signals to the scan lines 224 and the data lines 226 are formed.

Each of the respective pixels 300 includes a pixel circuit having a plurality of thin film transistors and an organic light emitting diode connected to the pixel circuit, and the scan driving unit 234 and the data driving unit 236 include circuits having a plurality of thin film transistors.

In addition, referring to FIG. 3B, an encapsulating substrate 400 for encapsulating the pixel region 220 is disposed on the substrate 210 in which the pixels 300 are formed and the encapsulating substrate 400 is bonded to the substrate 210 with sealing material 410 to complete a display panel 200.

The plurality of pixels 300, the scan driving unit 234, and the data driving unit 236, formed on the substrate 210 include a plurality of thin film transistors. In the embodiment, the thin film transistors provided in at least one of the pixels 300, the driving unit 234, and the data driving unit 236 are the oxide thin film transistors according to the embodiment as described with reference to FIGS. 1 and 2.

The organic light emitting display device according to the embodiment employs thin film transistors having an oxide semiconductor made of XZnSnO as thin film transistors provided in the pixels 300, the scan driving unit 234 and/or the data driving unit 236 so that an organic light emitting display device for performing more stable operation can be implemented.

While the present embodiments have been described in connection with certain exemplary embodiments, it is to be understood that the present embodiments are not limited to the disclosed embodiments, but, on the contrary, is intended to cover various modifications and equivalent arrangements included within the spirit and scope of the appended claims, and equivalents thereof.

What is claimed is:

1. A thin film transistor comprising:
   an oxide semiconductor layer including a source/drain region and a channel region;
   a gate electrode formed in a region overlapping with the channel region;
   a gate insulating layer formed between the oxide semiconductor layer and the gate electrode; and
   source/drain electrodes electrically connected to the source/drain regions of the oxide semiconductor layer;
   wherein the oxide semiconductor layer comprises ZnSnO and a material X having a difference of electronegativity from oxygen of at least about 2 and an atomic radius of from about 0.002 nm to about 0.013 nm.

2. The thin film transistor as claimed in claim 1, wherein, the content of X in the oxide semiconductor layer is from about 2% to about 20%.

3. The thin film transistor as claimed in claim 1, wherein the electronegativity of the material X is less than about 1.6.

4. The thin film transistor as claimed in claim 1, wherein an ion radius of the material X is from about 0.006 to about 0.009 nm.

5. The thin film transistor as claimed in claim 1, wherein an ion radius of the material X is from about 0.007 to about 0.008 nm.

6. The thin film transistor as claimed in claim 1, wherein the material X is one selected from the group consisting of Hf, Zr, Al, and Mg.

7. The thin film transistor as claimed in claim 1, wherein the material X is Hf.

8. The thin film transistor as claimed in claim 1, further comprising a protective layer formed between the oxide semiconductor layer and the source/drain electrodes.

9. The thin film transistor as claimed in claim 1, wherein the thin film transistor has an inverted staggered bottom gate structure.

10. The thin film transistor as claimed in claim 1, wherein the thin film transistor has a top gate structure.

11. An organic light emitting display device comprising
   pixels positioned at substantially every intersection of data lines and scan lines and respectively including a plurality of thin film transistors;

a scan driving unit including a plurality of thin film transistors configured to supply scan signals to the scan lines;

a data driving unit including a plurality of thin film transistors and configured to supply data signals to the data lines;

wherein each of the thin film transistors is provided to at least one of the pixels, the scan driving unit, and the data driving unit, wherein the thin film transistors comprise:

an oxide semiconductor layer including a source/drain region and a channel region;

a gate electrode formed in a region overlapping with the channel region;

a gate insulating layer formed between the oxide semiconductor layer and the gate electrode; and source/drain electrodes electrically connected to the source/drain regions of the oxide semiconductor layer;

wherein the oxide semiconductor layer comprises ZnSnO and a material X having a difference of electronegativity from oxygen of at least about 2 and an atomic radius of from about 0.002 nm to about 0.013 nm.

12. The organic light emitting display device as claimed in claim 11, wherein, the content of X in the oxide semiconductor layer is from about 2% to about 20%.

13. The organic light emitting display device as claimed in claim 11, wherein the electronegativity of the material X is less than about 1.6.

14. The organic light emitting display device as claimed in claim 11, wherein an ion radius of the material X is from about 0.006 to about 0.009 nm.

15. The organic light emitting display device as claimed in claim 11, wherein an ion radius of the material X is from about 0.007 to about 0.008 nm.

16. The organic light emitting display device as claimed in claim 11, wherein the material X is one selected from the group consisting of Hf, Zr, Al, and Mg.

17. The organic light emitting display device as claimed in claim 11, wherein the material X is Hf.

18. The organic light emitting display device as claimed in claim 11, further comprising a protective layer formed between the oxide semiconductor layer and the source/drain electrodes.

19. The organic light emitting display device as claimed in claim 11, wherein the thin film transistor has an inverted staggered bottom gate structure.

20. The organic light emitting display device as claimed in claim 11, wherein the thin film transistor has a top gate structure.

* * * * *